(12) United States Patent
Li et al.

(10) Patent No.: US 7,498,804 B1
(45) Date of Patent: Mar. 3, 2009

(54) RESONANCE CURRENT SENSING

(75) Inventors: Kang Li, Windsor (CA); Dwayne Scott Bontrager, Canton, MI (US)

(73) Assignee: Yazaki North America, Inc., Canton, MI (US)

( * ) Notice: Subject to any disclaimer, the term of this patent is extended or adjusted under 35 U.S.C. 154(b) by 193 days.

(21) Appl. No.: 11/581,708

(22) Filed: Oct. 16, 2006

(51) Int. Cl.
*G01N 27/72* (2006.01)
(52) U.S. Cl. .................. 324/228; 324/260; 324/236
(58) Field of Classification Search ............ 324/546, 324/117 R, 260, 252, 253
See application file for complete search history.

(56) References Cited

U.S. PATENT DOCUMENTS

| | | |
|---|---|---|
| 4,680,529 A | 7/1987 | Komurasaki et al. |
| 5,325,044 A | 6/1994 | Bartol |
| 5,734,264 A | 3/1998 | Berna et al. |
| 6,137,203 A | 10/2000 | Jermakian et al. |
| 6,348,751 B1 | 2/2002 | Jermakian et al. |
| 6,566,856 B2 | 5/2003 | Sandquist et al. |
| 6,710,587 B1 * | 3/2004 | Reynoso et al. ......... 324/117 R |
| 7,365,535 B2 * | 4/2008 | Muniraju et al. ............ 324/252 |
| 2007/0121249 A1 * | 5/2007 | Parker ........................ 360/126 |

* cited by examiner

*Primary Examiner*—Vincent Q. Nguyen
*Assistant Examiner*—Thomas F. Valone
(74) *Attorney, Agent, or Firm*—Harness, Dickey & Pierce, P.L.C.

(57) ABSTRACT

A current measurement system includes a magnetic core having an inside area through which a conductor carrying current to be measured extends. A measurement winding is wound on the magnetic core. A voltage source couples to the measurement winding to generate current through the measurement winding. A gap of low permeability material is disposed in the magnetic core. A sensing device is positioned in the gap, wherein the sensing device generates a control signal having one of a first state and a second state based on a strength and a direction of a magnetic field in the gap.

20 Claims, 5 Drawing Sheets

RESONANCE CURRENT SENSING

FIELD

The present teachings relate to methods and systems for measuring current.

BACKGROUND

Typically, devices for measuring electric current may include at least one probe sensitive to a magnetic flux and arranged in an air gap of an annular core. At least one conductor passes through the core. A current to be measured passes through the conductor and generates a magnetic field. A voltage source supplies current to a compensation winding wound on the core that generates a second magnetic field. The probe measures the combined effects of the two magnetic fields and controls the voltage source such that the second magnetic field cancels the first magnetic field. As shown in FIG. 1, this results in a compensating current ($I_M$) that is proportional to the current under measure ($I_S$). The compensating current ($I_M$) can then be measured based on the voltage and a known resistance.

Such methods and systems rely on the measurement accuracy of the probe around zero magnetic field. Many factors, such as ambient air temperature, device drifting and offsets, and sensor resolution can affect the measurement accuracy of the probe. Additional circuitry and/or specific calibrations can be used to compensate for the various factors affecting measurement accuracy. Such additions can be costly.

SUMMARY

The present teachings generally include a current measurement system. The current measurement system includes a magnetic core having an inside area through which a conductor carrying current to be measured extends. A measurement winding is wound on the magnetic core. A voltage source couples to the measurement winding to generate current through the measurement winding. A gap of a low permeability material is disposed in the magnetic core. A sensing device is positioned in the gap that generates a control signal having one of a first state and a second state based on a strength and a direction of a magnetic field in the gap.

Further areas of applicability will become apparent from the description provided herein. It should be understood that the description and specific examples are intended for purposes of illustration only and are not intended to limit the scope of the present teachings.

BRIEF DESCRIPTION OF THE DRAWINGS

The drawings described herein are for illustration purposes only and are not intended to limit the scope of the present teachings in any way.

DETAILED DESCRIPTION

Figure 1:
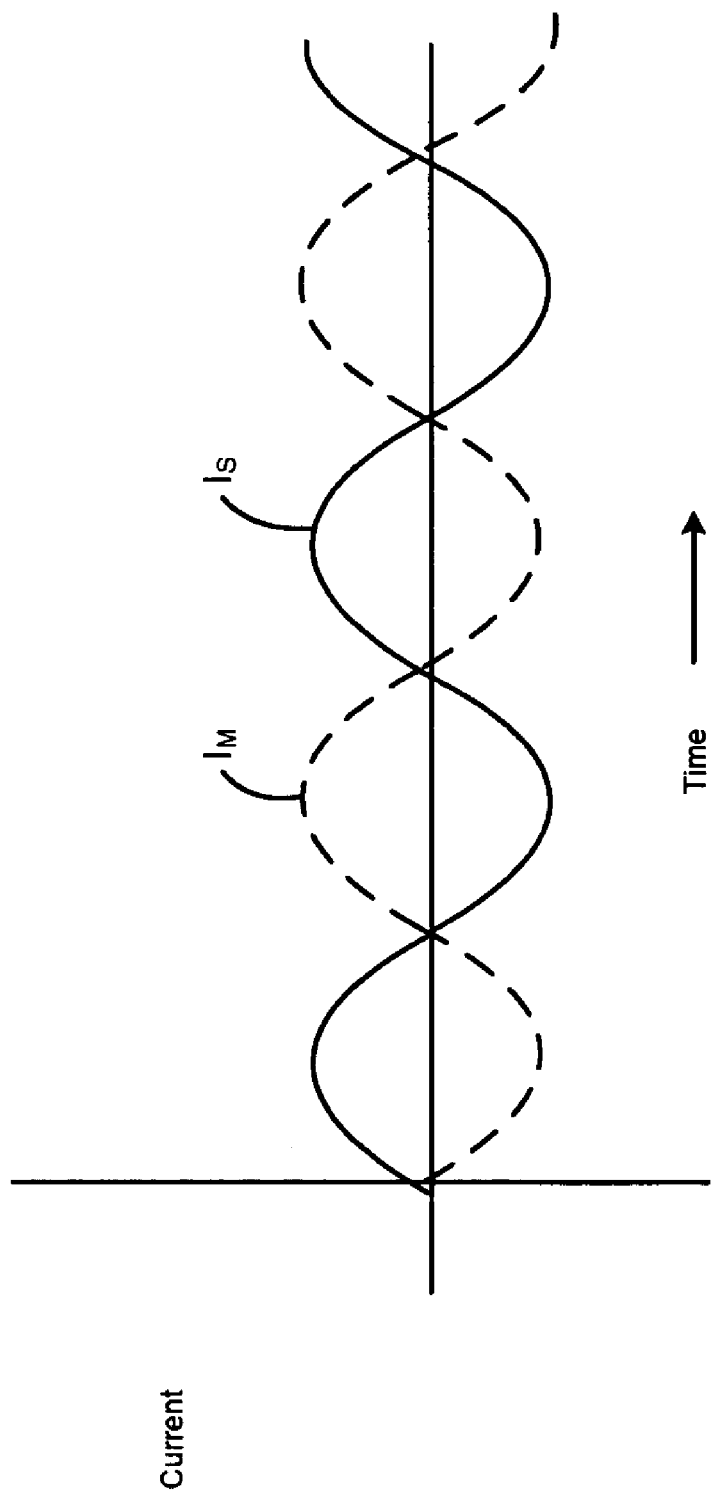
FIG. 1 is a prior art graph illustrating exemplary current signals as generated by a current measurement device.

The following description is merely exemplary in nature and is not intended to limit the present teachings, their application, or uses. It should be understood that throughout the drawings, corresponding reference numerals indicate like or corresponding parts and features. As used herein, the term module can refer to an application specific integrated circuit (ASIC), an electronic circuit, a processor (shared, dedicated, or group) and memory that can execute one or more software or firmware programs, a combinational logic circuit, other suitable components and/or one or more combinations thereof that provide the described functionality.

Figure 2:
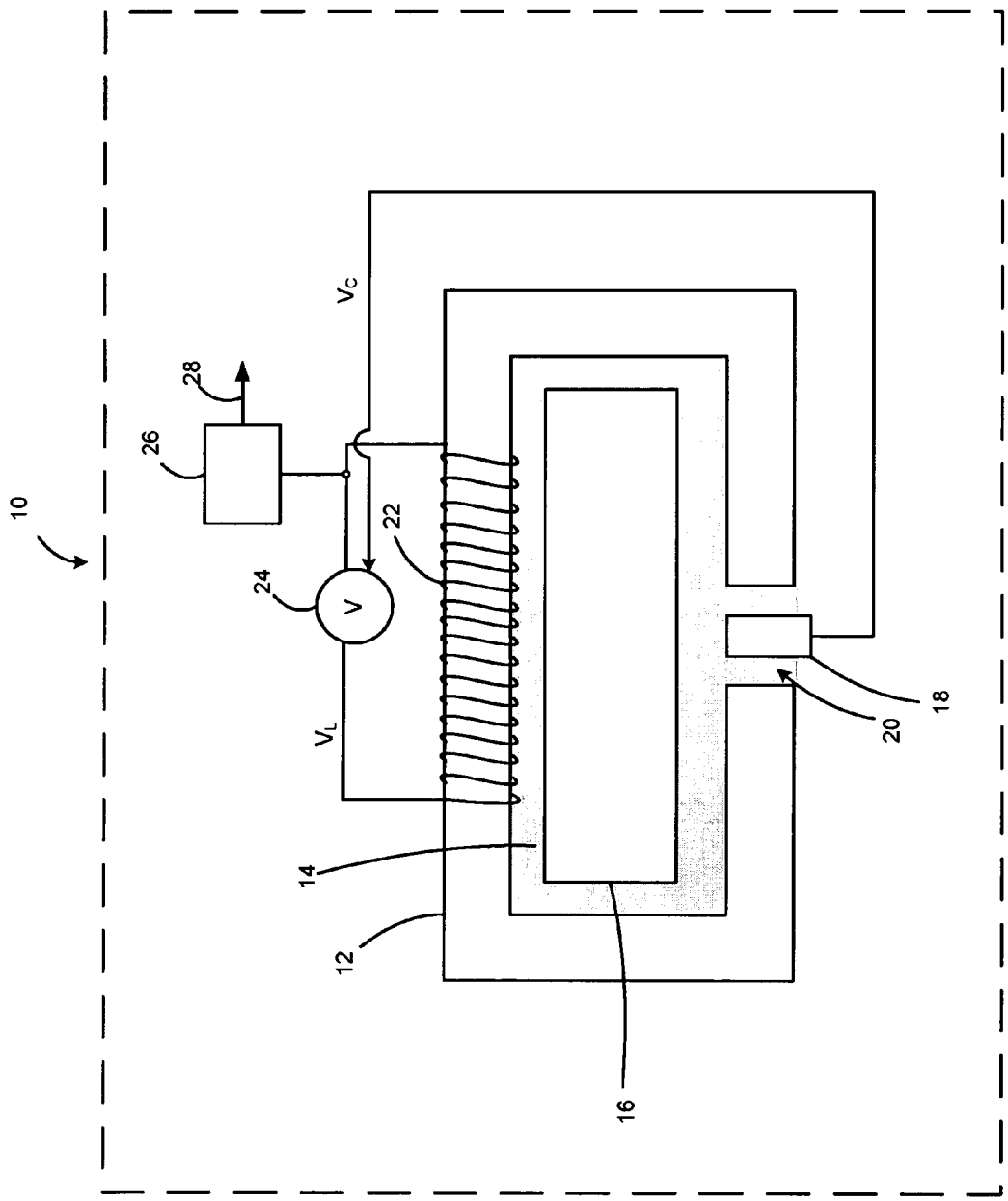
FIG. 2 is a block diagram illustrating a current measurement device in accordance with various aspects of the present teachings.

With reference to FIG. 2, a current measurement device is shown generally at 10 and can include a magnetic core 12. The magnetic core 12 can include an open center area 14 through which an electric conductor 16 can pass. A sensing device 18 can be disposed within a small gap of low permeability material (such as air) 20 within the magnetic core 12. The sensing device 18 can be a solid state device that generates a control signal ($V_C$) according to one of two states (i.e., high and low or positive and negative). A measurement winding 22 can be wound around the magnetic core 12 according to a number (N) of turns. The number of N turns can be optimized based on a maximum current to be measured. It can be appreciated in light of the disclosure, that the measurement winding 22 can be tightly coupled to the magnetic core 12 to minimize magnetic field leakage.

A controlled voltage source 24 having an output of either ($V_L$) or ($-V_L$) can couple to the measurement winding 22. The controlled voltage source 24 can generate a changing (increasing or decreasing) current through the measurement winding 22 due to the winding inductance. The controlled voltage source 24 output polarity is based on the control signal $V_C$ that can be received from the sensing device 18. An output component 26 can translate the current in the measurement winding 22 to an output signal 28. It can be appreciated in light of the disclosure that the output component 26 can include a low-pass filter (not specifically illustrated) and a signal processing unit (not specifically illustrated). The low-pass filter can smooth the current wave form. The signal processing circuit can translate the smoothed current wave to a signal as required by the measuring application.

In various embodiments, the current measurement device 10 can measure current according to the following method. The electric conductor 16 can carry a current to be measured ($I_S$) which can induce a first magnetic field. A controlled current ($I_M$) can be generated by the voltage source ($V_L$ or $-V_L$) which can induce a second magnetic field. The two magnetic fields can be opposite in direction. The first magnetic field can be proportional to the current of the electric conductor $I_S$. The second magnetic field can be proportional to the apparent current ($I'_M$) which equals the number of turns N multiplied by a current ($I_M$) from the controlled voltage source. Because the first magnetic field and the second magnetic field can be controlled to be opposite in direction, they can tend to cancel each other out. Therefore, the combination of the two magnetic fields can be proportional to the difference between the measured current $I_S$ and the controlled current $I'_M$. Therefore, the sensing device 18 can measure the summation of the two magnetic fields and can generate an output state signal according to the total magnetic field strength and direction.

Based upon the control signal states the voltage source will output a positive or negative voltage. Since the combined magnetic field can go positive or negative, the output of the sensing device can be a positive or negative value. To deal with the positive and negative outputs of the sensing device, there can be two trip points. The unbalanced offset and drifts on the trip points, however, can affect the measurement. To that end, the offset can be adjusted to an acceptable range to establish the trip points on both sides with either no drift or drifting in opposite direction with the same amount, i.e., keeping the center point to remain the same. Instead of controlling the offset and the drifts on both of the trip points individually, the present teachings use only one trip point of the circuit for both sides. Thus, the drifts regarding to the center point of the $I_M$ switching hysteresis is always balanced.

As shown in Table 1 below, the summation of the two magnetic fields can be compared to a hysteresis value that is proportional to $I_S - I'_M$ (DI) to determine the control signal $V_C$. The control signal can be one of two states (e.g., state 1 and state 2). The sensing device 18 can generate a control signal at a first state when the summation of the magnetic field is proportional to a positive value of $I_S - I'_M$ (DI+). Controlling the voltage source 24 at a first state, for example, can cause the voltage $V_L$ to become positive thereby causing the controlled current $I'_M$ to increase. The sensing device 18 generates an output signal at a second state when the summation of the magnetic field is proportional to a negative value of $I_S - I'_M$ (DI−). Controlling the voltage source 24 at a second state, for example, can cause the voltage $V_L$ to become negative thereby causing the controlled current $I'_M$ to decrease.

TABLE 1

| Magnetic Field | $V_C$ | $V_L$ | $I'_M$ |
|---|---|---|---|
| $I_S - I'_M = DI+$ | State 1 | Positive | Increase |
| $I_S - I'_M = DI-$ | State 2 | Negative | Decrease |

Figure 3:
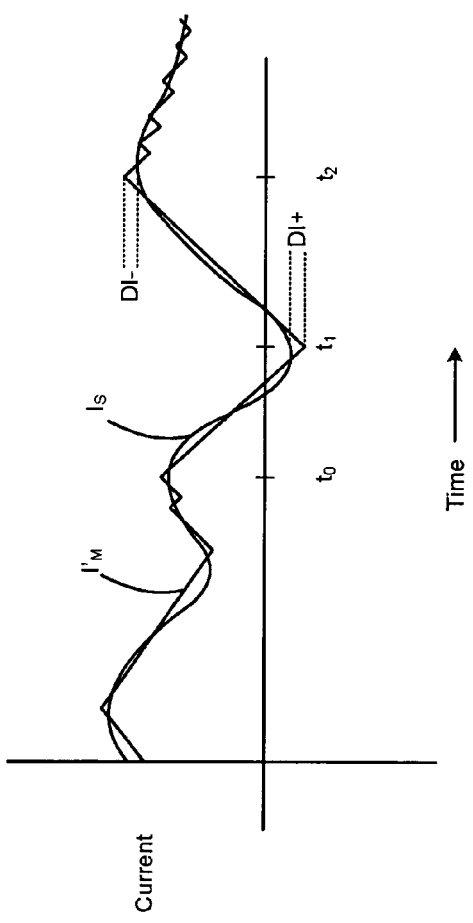
FIG. 3 is a graph illustrating exemplary current signals as generated by an exemplary aspect of the present teachings.
Figure 4:
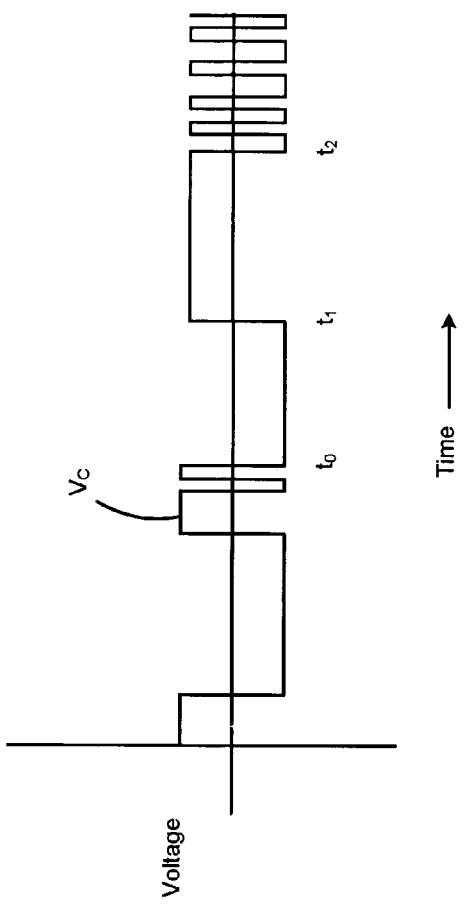
FIG. 4 is a graph illustrating an exemplary voltage control signal as generated by an exemplary aspect of the present teachings.

With reference to FIGS. 3 and 4, exemplary current ($I_S$ and $I'_M$) and voltage ($V_C$) signals that can be generated, for example, based on the methods and systems discussed above, are shown in accordance with the present teachings. As shown in FIG. 3, the controlled current $I'_M$ can track the measured current $I_S$. The controlled current $I'_M$ can oscillate around the measured current $I_S$ by a hysteresis value DI. This can be due to the sensing device 18 (FIG. 2) controlling the state of the voltage source 24 (FIG. 2) that can be based on the strength and direction of the magnetic field and according to the predefined trip points (also referred to as the hysteresis values of DI).

For example and as shown in FIGS. 3 and 4, at time $t_0$, $V_C$ can be −1 and the voltage source 24 (FIG. 2) can output a negative voltage $V_L$, that can cause the current $I'_M$ in the measurement winding 22 (FIG. 2) to decrease. At some time between time t0 and time t1, $I_S$ can become greater than $I'_M$. Since $I_S - I'_M <$ DI, $V_C$ can remain at −1. At time $t_1$, $I_S - I'_M$ can be equal to DI, which can cause $V_C$ to jump to 1 and the voltage source 24 (FIG. 2) to output a positive voltage $V_L$. This can cause $I'_M$ to increase. At time $t_2$, $I_S - I'_M$ can equal −DI and can cause $V_C$ to transition to −1 and force $I'_M$ to decline again. The control signal $V_C$ can continue to oscillate as long as the system in energized. The mean value of the controlled current $I'_M$ can follow the measurement target $I_S$. The fluctuation in $I'_M$ and the oscillation frequency can depend on the output amplitude of the voltage source 24 (FIG. 2) and the inductance of the measurement winding 22 (FIG. 2).

Figure 5:
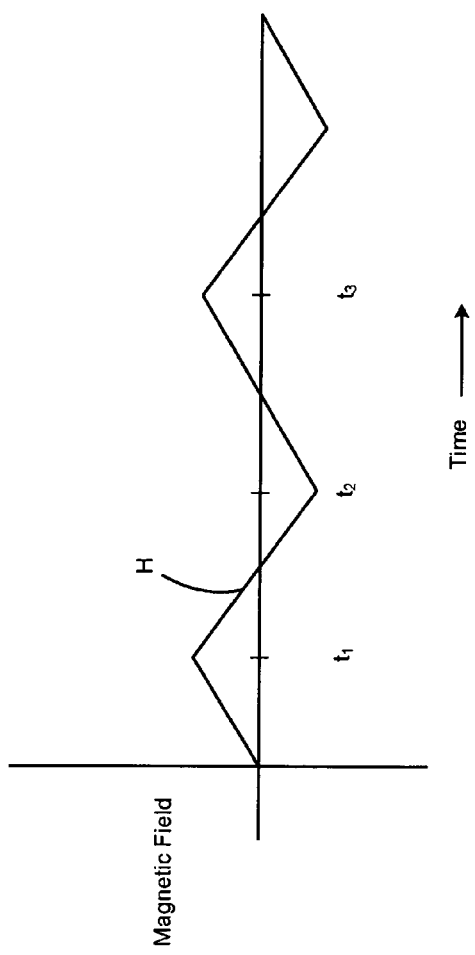
FIG. 5 is a graph illustrating an effective core magnetic field of an exemplary aspect of the present teachings.
Figure 6:
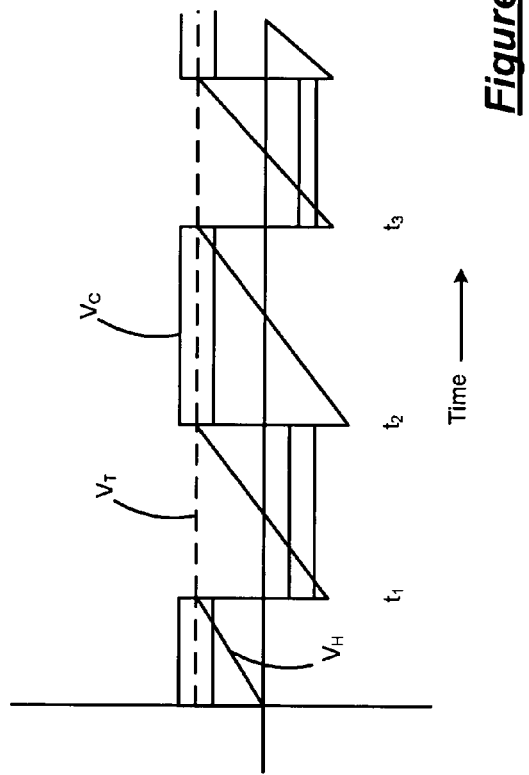
FIG. 6 is a graph illustrating voltage signals of the exemplary Hall effect sensor of FIGS. 5 and 7.
Figure 7:
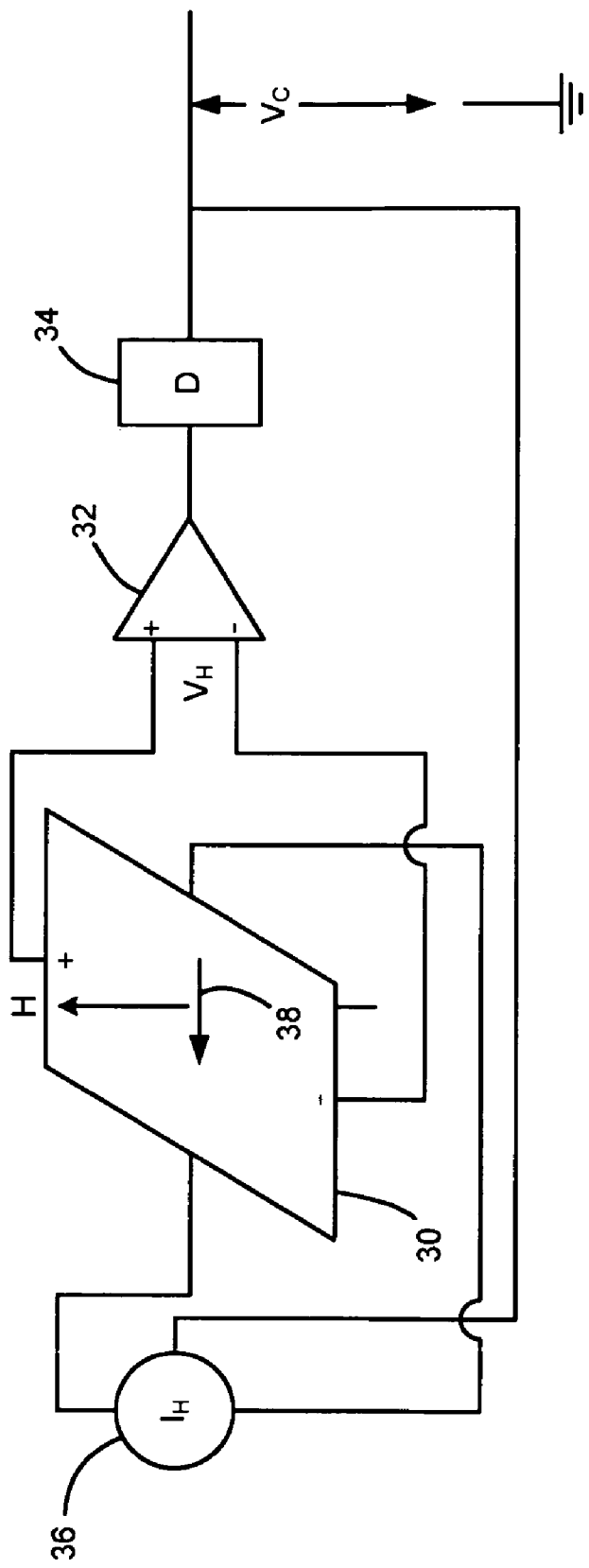
FIG. 7 is diagram illustrating an exemplary embodiment of a current measurement system including a Hall effect sensor and a single trip point.

In one aspect of the present teachings and with reference to FIGS. 5, 6, and 7, a measurement method can be implemented using a single trip point ($V_T$) and a Hall effect sensing device 30 (FIG. 7). For example and with reference to FIGS. 5 and 6, between time t0 and t1, the magnetic field strength H (FIG. 5) can increase and the Hall effect sensor output $V_H$ (FIG. 6) can follow. At time t1, the magnetic field strength H can cause the sensor output voltage $V_H$ to reach a trip point $V_T$ of a voltage comparator 32. The voltage comparator 32 can output a logical signal (1) to trigger a D-Latch 34 that can cause an output voltage $V_C$ to change. The output voltage $V_C$ can control the voltage supply source (24 in FIG. 2) and the current source 36 to change polarity. Since the current 38 changed direction while the effective magnetic field H can be still in the same direction, $V_H$ can change polarity as well.

The changed $V_H$ can cause the comparator 32 to output a logical signal (0) which has no effect on the D-Latch 34 output. Driven by an opposite voltage, $I_M$ and the effective magnetic filed strength H can decline. However, when the current flows in the opposite direction, the sensor output $V_H$ can increase from a negative value and can keep increasing until the sensor output $V_H$ reaches the same trip point $V_T$ at time $t_2$. Then, the comparator 32 and the D-Latch 34 can trigger again, as described above.

While specific aspects have been described in this specification and illustrated in the drawings, it will be understood by those skilled in the art that various changes can be made and equivalents can be substituted for elements thereof without departing from the scope of the present teachings, as defined in the claims. Furthermore, the mixing and matching of features, elements and/or functions between various aspects of the present teachings may be expressly contemplated herein so that one skilled in the art will appreciate from the present teachings that features, elements and/or functions of one aspect of the present teachings may be incorporated into another aspect, as appropriate, unless described otherwise above. Moreover, many modifications may be made to adapt a particular situation, configuration or material to the present teachings without departing from the essential scope thereof. Therefore, it may be intended that the present teachings not be limited to the particular aspects illustrated by the drawings and described in the specification as the best mode presently contemplated for carrying out the present teachings but that the scope of the present teachings will include many aspects and examples following within the foregoing description and the appended claims.

What is claimed is:

1. A current measurement system comprising:
   a magnetic core having an inside area through which a conductor carrying a first current to be measured extends;
   a measurement winding wound on the magnetic core;
   a voltage source coupled to the measurement winding to generate a second current through the measurement winding;
   a gap of low permeability material in the magnetic core;
   a sensing device positioned in the gap that generates a sensor output voltage based on a strength and direction of a magnetic field in the gap;
   a comparator that outputs a D-latch control signal based on the sensor output voltage; and
   a D-latch that generates a control signal having one of a first state and a second state based on the D-Latch control signal, wherein the control signal changes between the first and second states only when the sensor output voltage reaches a single voltage trip point.

2. The system of claim 1 wherein the magnetic field in the gap is a combination of a first magnetic field induced by the first current flowing through the conductor and a second magnetic field induced by the second current flowing through the measurement winding.

3. The system of claim 2 wherein the D-latch generates the control signal at the first state when the first magnetic field dominates the second magnetic field and generates the control signal at the second state when the second magnetic field overcomes the first magnetic field.

4. The system of claim 2 wherein the first current is proportional to the first magnetic field and wherein the second current is proportional to the second magnetic field.

5. The system of claim 4 wherein the amplitude of the second current oscillates around the amplitude of the first current.

6. The system of claim 5 wherein an average value of the second current follows a value of the first current.

7. The system of claim 1 wherein the sensing device is a solid state device.

8. The system of claim 1 wherein the first state of the control signal enables the voltage source to output the first voltage and the second state of the control signal enables the voltage source to output the second voltage, which has the same amplitude but opposite polarity of the first voltage.

9. The system of claim 4 wherein the measurement winding is wound N times and wherein the second magnetic field is proportional to the second current multiplied by N.

10. The system of claim 1 further comprising an output component coupled to the measurement winding and that generates an output signal based on the second current through the measurement winding.

11. The system of claim 10 wherein the output component includes a low-pass filter for smoothing the output signal.

12. The system of claim 10 wherein the output component includes a signal processing circuit for translating the output signal.

13. A current measurement method, comprising:
generating a first magnetic field by passing a first current to be measured through a conductor;
generating a second magnetic field by passing a second current through a measurement winding wound on a magnetic core;
sensing a third magnetic field as a combination of the first magnetic field and the second magnetic field;
generating a sensor output voltage based on a strength and a direction of the third magnetic field;
comparing the sensor output voltage to a single voltage trip point to obtain a D-latch control signal;
generating a control signal having one of a first state and a second state based on the D-latch control signal being received at a D-latch, wherein the control signal changes between the first and second states only when the sensor output voltage reaches the single voltage trip point; and
controlling the second magnetic field based on the control signal.

14. The method of claim 13 further comprising measuring the second current associated with the second magnetic field.

15. The method of claim 14 further comprising generating an output signal based on an average of the second current of the second magnetic field.

16. The method of claim 14 further comprising translating the second current to a signal intelligible by a measuring application.

17. The method of claim 14 further comprising applying a low-pass filter to the second current.

18. The system of claim 10 wherein the output signal comprises a mean of the second current.

19. The system of claim 10 wherein the output signal comprises an average of the second current.

20. The method of claim 13 further comprising generating an output signal based on a mean of the second current of the second magnetic field.

* * * * *